United States Patent [19]

Needes

[11] 4,235,644
[45] Nov. 25, 1980

[54] THICK FILM SILVER METALLIZATIONS FOR SILICON SOLAR CELLS

[75] Inventor: Christopher R. S. Needes, Newark, Del.

[73] Assignee: E. I. Du Pont de Nemours and Company, Wilmington, Del.

[21] Appl. No.: 71,683

[22] Filed: Aug. 31, 1979

[51] Int. Cl.³ .......................................... H01L 31/04
[52] U.S. Cl. ..................... 136/256; 357/30; 357/67; 427/88; 252/514; 106/1.14; 106/1.19
[58] Field of Search ............... 136/89 CC; 427/88; 357/30, 67; 252/514; 106/1.14, 1.19

[56] References Cited

U.S. PATENT DOCUMENTS

| | | | |
|---|---|---|---|
| 2,461,878 | 2/1949 | Christensen et al. | 106/1.14 X |
| 3,106,489 | 10/1963 | Lepselter | 427/89 |
| 3,440,062 | 4/1969 | Hoffman | 106/1.13 |
| 3,686,036 | 8/1972 | Gereth et al. | 136/89 |
| 3,741,780 | 6/1973 | Hoffman | 106/1.19 |
| 3,896,054 | 7/1975 | Larry | 106/1.14 |
| 4,001,146 | 1/1977 | Horowitz | 252/514 |
| 4,029,518 | 6/1977 | Matsutani et al. | 136/89 SG |
| 4,082,568 | 4/1978 | Lindmayer | 136/89 CC |
| 4,153,907 | 5/1979 | Kofron | 357/30 |
| 4,163,678 | 8/1979 | Bube | 136/89 CC |
| 4,165,241 | 8/1979 | Yerkes et al. | 136/89 CC |

OTHER PUBLICATIONS

E. L. Ralph, "Recent Advances in Low Cost Solar Cell Processing," *Conf. Record, 11th IEEE Photovoltaic Specialists' Conf.* (1975), pp. 315–316.

M. B. Field et al., "Application of Thick-Film Technology to Solar Cell Fabrication," *Conf. Record, 12th IEEE Photovoltaic Specialists Conf.* (1976), pp. 303–308.

A. D. Haigh, "Fired Through Printed Contacts on Antireflection Coated Silicon Terrestrial Solar Cells," *Conf. Record, 12th IEEE Photovoltaic Specialists Conf.* (1976), pp. 360–361.

L. Frisson et al., "Screen Printed Contacts On Silicon Solar Cells With Low Series Resistance," *Conf. Record, 13th IEEE Photovoltaic Specialists Conf.* (1978), pp. 590–592.

*Primary Examiner*—Aaron Weisstuch

[57] ABSTRACT

Thick film conductor compositions containing silver powder and lead bismuthate glass frit powder and an organic vehicle/solvent system are presented for use as grid metallizations to the n-type layers of n- on p- silicon solar cells.

3 Claims, No Drawings

THICK FILM SILVER METALLIZATIONS FOR SILICON SOLAR CELLS

TECHNICAL FIELD

This invention relates to thick film silver compositions useful for the preparation of grid metallizations to the n-type layers of silicon solar cells.

BACKGROUND ART

Substantial development work has taken place relating to making electrical contacts to semiconductor devices such as photovoltaic cells by using so-called thin film techniques. Among the more popular thin film techniques are vacuum deposition and sputtering. These methods enable the formation of pure metal, metal mixture and laminated metal contacts to silicon. Pure silver contacts made in this way have yielded excellent electrical properties but questionable adhesion strength. This was improved upon by the interposition of a thin layer of titanium between the silicon and the silver as disclosed in U.S. Pat. No. 3,106,489. Unfortunately, such titanium-silver contacts were found to degrade in a humid environment and this lead to the development of the titanium-palladium-silver contact, details of which are given in U.S. Pat. No. 3,686,036. An improved version of the titanium-palladium-silver contact in which the titanium-palladium layer actually comprises a titanium-titanium/palladium-palladium layer to improve adhesion, and the silver is plated on by electroless deposition, is disclosed in U.S. Pat. No. 4,082,568. The very complexity of the above process suggests that it is impracticable for the needs of solar cells for the 1980's.

Thick film technology, on the other hand, appears to be a more practical alternative to thin film deposition. Thick film compositions containing silver and a dopant material of the n- or p-type have been applied to p- or n-type silicon semiconductor wafers by screen printing techniques. The compositions are then fired. During sintering of the metallization the dopant diffuses into the silicon and serves to enhance the current carrier concentration in the vicinity of the metallization. The addition of dopant is carried out so that the contact resistance of the conductor-forming material is minimized. A contact resistance of less than 10 m$\Omega$-cm$^2$ is acceptable. Such thick film technology is described in U.S. Pat. Nos. 4,153,907 and 4,163,678.

In U.S. Pat. No. 4,153,907, the dopant material is phosphorus derived from phosphorus-doped nickel powder for n-type silicon and boron derived from borosilicate glass for p-type silicon. In U.S. Pat. No. 4,163,678, a composition is disclosed comprising silver and silver metaphosphate powders dispersed in an ethyl cellulose-butyl carbitol acetate vehicle solvent system. This composition is applied to n-type silicon. The dopant employed is phosphorus derived from silver metaphosphate.

These two prior art compositions suffer from having a tendency to diffuse too deeply into the n-layer of the solar cell. Diffusion in the proximity of the p-n junction runs the risk of affecting the quality of the solar cell. A practical composition that does not rely on the diffusion of a dopant material component is needed.

DISCLOSURE OF INVENTION

This invention provides a silver powder-lead bismuthate glass frit powder composition for the production of grid metallizations to the n-type layers of n- on p-silicon solar cells. Such metallizations yield low contact resistance, exhibit excellent solder adhesion and solderability and permit the production of solar cells with very good electrical characteristics.

The composition of this invention does not diffuse appreciably into the silicon under the firing condition employed in the thick film processing sequence. Thus the invention does not rely on the diffusion of dopant materials such as phosphorous to achieve good electrical contact between the metallization and the silicon. Moreover it avoids the restriction on processing conditions caused by the uncontrolled diffusion of the dopant materials through the p-n junction and the resultant degradation of the electrical properties of the solar cell.

A further advantage of the present invention is that it offers a relatively broad processing window. Compositions formulated with many glass frits including those of the lead borosilicate type yield very narrow processing windows. The reason is associated with the formation of an unidentified resistive layer during firing which degrades the electrical performance of the solar cell by increasing its series resistance. The lead bismuthate glass frits used in the present invention offer a greater resistance to the formation of this resistive layer and as a direct consequence, provide a broad processing window.

The composition of this invention comprises a mixture of silver powder and lead bismuthate glass frit powder having a mean particle size in the 0.2 to 20 micrometer range dispersed in a vehicle such as ethyl cellulose dissolved in a terpineol solvent.

The composition is applied to a silicon substrate by screen printing and is fired at a temperature in the range of 550° to 750° C.

FURTHER DESCRIPTION OF THE INVENTION AND BEST MODE

The composition of the present invention contains these essential ingredients, silver powder, lead bismuthate glass frit powder and an organic vehicle/solvent system.

The silver powder is selected so that it has a mean particle size of 0.2 to 10 micrometers and a preferred particle size in the 0.5 to 5 micrometer range. In terms of total solids the silver content varies from 88 to 97% by weight. The preferred silver content is 93% by weight.

The lead bismuthate glass frit powder should have a mean particle size in the 1 to 20 micrometer size range and a preferred mean particle size in the 2 to 10 micrometer size range. In terms of total solids, the glass frit should vary from 3 to 12% by weight. The preferred glass frit content is 7% by weight.

The lead bismuthate glass frit powder will comprise at least 60% by weight $Bi_2O_3$. The glass frit can also contain PbO, $SiO_2$ and $B_2O_3$. Preferred is a glass frit containing 70 to 95% by weight $Bi_2O_3$, 3 to 30% by weight PbO and 1 to 10% by weight each of $B_2O_3$ and $SiO_2$.

The vehicle employed can be any of the solvents customarily employed with thick film compositions. Preferred is a vehicle comprising 10% ethyl cellulose dissolved in terpineol.

The solvent can also be any of the type customarily used with thick film compositions; however, terpineol is preferred.

In terms of the total composition, the solids are present in the range of 65 to 75% by weight and the vehicle plus solvent in the range of 25 to 35% by weight. Most preferred is a composition with 73% by weight solids, 23% by weight vehicle, and 4% by weight additional solvent.

The composition is prepared by dispersing the silver and lead bismuthate glass frit powders in a vehicle and solvent medium. The resulting composition has a paste-like consistency.

The composition is screen printed on the n-layer of a silicon p-n junction and then dried at 125° C. for 10 minutes to remove the solvent. The vehicle is thereafter burned out by heating at 325° C. for 10 minutes. Finally, the metallization is fired at a temperature in a range of 550° to 750° C. for 1 to 10 minutes.

Examples of the composition and process of the present invention, in which parts and percents are by weight, unless otherwise indicated, are as follows:

EXAMPLE I

A composition comprising 68 percent silver, 5 percent of a lead bismuthate glass frit containing 82 percent $Bi_2O_3$, 11 percent PbO, 3.5 percent $B_2O_3$, and 3.5 percent $SiO_2$, 23 percent vehicle (10 percent ethyl cellulose dissolved in terpineol) and 4 percent terpineol was formulated. The viscosity as measured on a Brookfield viscometer, HBT model using a utility cup and spindle at 10 rpm was 70 Pascal seconds at 25° C. The material was screen printed using a 325 mesh stainless steel screen onto the n-layer of a silicon p-n junction, previously coated on the p-layer with a commercial aluminum-silver metallization. Silicon substrates coated with this composition were then fired separately at temperatures of 600°, 650° and 700° C. for periods of 1, 2, 3 and 4 minutes.

EXAMPLE II

A composition comprising 68 percent silver, 5 percent of a lead bismuthate frit containing 87 percent $Bi_2O_3$, 11 percent PbO, 1.0 percent $B_2O_3$ and 1 percent $SiO_2$, 23 percent vehicle (10 percent ethyl cellulose dissolved in terpineol) and 4 percent terpineol was formulated. The composition was screen printed using a 325 mesh stainless steel screen onto the n-layer of a silicon p-n junction previously coated on the p-layer with a commercial aluminum-silver metallization. Silicon substrates coated with this composition were then fired separately at temperatures of 600°, 650° and 700° C. for times between 1 and 4 minutes.

EXAMPLE III

A composition comprising 69 percent silver, 4 percent of a lead bismuthate frit containing 83 percent $Bi_2O_3$, 5 percent PbO, 3 percent $SiO_2$ and 9 percent $B_2O_3$, 23 percent vehicle (10 percent ethyl cellulose dissolved in terpineol) and 4 percent terpineol was formulated. The composition was screen printed using a 325 mesh stainless steel screen onto the n-layer of a silicon p-n junction previously coated on the p-layer with a commercial aluminum-silver metallization. Silicon substrates coated with this composition were then fired separately at temperatures of 600°, 650° and 700° C. for times between 1 and 4 minutes.

The following comparative compositions not within the scope of the present invention were also prepared.

Composition A

A composition was prepared containing 67 percent silver, 5 percent of a glass frit comprising 62 percent PbO, 10 percent $B_2O_3$, 24 percent $SiO_2$ and 4 percent $Al_2O_3$; 22 percent of a vehicle (10 percent ethyl cellulose in terpineol) and 6 percent of terpineol.

Composition B

A composition was prepared containing 68 percent silver, 5 percent of a glass frit comprising 59 percent PbO, 23 percent $SiO_2$, 8 percent $B_2O_3$, 4 percent CdO and 6 percent $TiO_2$; 23 percent of a vehicle (10 percent ethyl cellulose in terpineol) and 4 percent terpineol.

Composition C

A composition was prepared containing 68 percent silver, 5 percent of a glass frit comprising 51 percent PbO, 31 percent $SiO_2$, 6 percent $B_2O_3$, 4 percent $ZrO_2$, 5 percent $Na_2O$, 2 percent ZnO and 1 percent TiO; 23 percent vehicle (10 percent ethyl cellulose dissolved in terpineol) and 4 percent terpineol.

Each of Compositions A–C was screen printed and fired in the manner of the compositions of Examples I, II and III.

Each of the compositions of Examples I, II and III were compared with the compositions of A through C using four test methods or criteria; namely, contact resistance, solder adhesion, solderability, and performance coefficient.

Contact resistance measurements were made using the standard four-point probe method. This is a procedure familiar to those skilled in making electrical measurements.

Solder adhesion was evaluated by the measurement of the pull strength of a wire attached by solder to a 0.2 cm square pad of metallization fired on silicon.

A qualitative measure of solderability was made by assessing the quality of the solder wetting of 0.012 cm wide lines. The solderability was rated 1 to 10.

A performance coefficient was determined by the measurement of the current-voltage characteristics of the solar cell during irradiation by simulated sunlight. The performance coefficient is defined as $(V_{20}/V_{OC})-(I_{0.48}/I_{SC})$. $V_{20}$ equals the voltage at 20 mA-cm$^2$. $V_{OC}$ is the open-current voltage. $I_{0.48}$ is the current density at 0.48 V. $I_{SC}$ is the short circuit current density.

The results of the comparison are set forth in the following tables.

| CONTACT RESISTANCE MEASUREMENTS (mΩ-cm$^2$) | | | | |
|---|---|---|---|---|
| Compositions fired at 600° C. | | | | |
| | 1 | 2 | 3 | 4 (Min) |
| Example I | 560 | 190 | 1.4 | 0.1 |
| Example II | 18 | 3.6 | <0.1 | 2.6 |
| Example III | 170 | 64 | 8.1 | 9.5 |
| Composition A | >1000 | >1000 | >1000 | 6.6 |
| Composition B | >1000 | >1000 | >1000 | >1000 |
| Composition C | >1000 | 450 | 540 | >1000 |
| Compositions fired at 650° C. | | | | |
| | 1 | 2 | 3 | 4 (Min) |
| Example I | 10 | <0.1 | <0.1 | 17 |
| Example II | 5 | <0.1 | <0.1 | 2 |
| Example III | 45 | <0.1 | 0.9 | 80 |
| Composition A | >1000 | 0.2 | 2.0 | 15 |
| Composition B | >1000 | >1000 | 560 | >1000 |
| Composition C | 670 | 120 | 100 | 630 |
| Compositions fired at 700° C. | | | | |

CONTACT RESISTANCE MEASUREMENTS (mΩ-cm²) -continued

| | 1 | 2 | 3 | 4 (Min) |
|---|---|---|---|---|
| Example I | <0.1 | <0.1 | 10 | 13 |
| Example II | 1.0 | <0.1 | 0.1 | 7 |
| Example III | 30 | 8.6 | 5.2 | 45 |
| Composition A | 5.2 | <0.1 | 6.4 | — |
| Composition B | >1000 | 800 | 750 | >1000 |
| Composition C | 11 | 25 | 45 | 65 |

SOLDER ADHESION MEASUREMENTS (NEWTON)

Compositions fired at 600° C.

| | 1 | 2 | 3 | 4 (Min) |
|---|---|---|---|---|
| Example I | 5.32 | 6.07 | 6.46 | 7.98 |
| Example II | 4.61 | 5.82 | 4.95 | 5.27 |
| Example III | 6.14 | 7.20 | 5.77 | 4.63 |
| Composition A | 0.49 | 1.27 | 1.41 | 1.02 |
| Composition B | 1.21 | 4.85 | 3.26 | 2.15 |
| Composition C | 2.45 | 1.76 | 2.19 | 1.89 |

Compositions fired at 650° C.

| | 1 | 2 | 3 | 4 (Min) |
|---|---|---|---|---|
| Example I | 7.44 | 9.05 | 10.52 | 10.49 |
| Example II | 6.53 | 6.92 | 6.22 | 5.71 |
| Example III | 8.02 | 9.49 | 10.63 | 11.80 |
| Composition A | 1.57 | 2.35 | 3.15 | 3.95 |
| Composition B | 2.08 | 5.03 | 4.19 | 3.52 |
| Composition C | 3.82 | 5.58 | 5.43 | 5.67 |

Compositions fired at 700° C.

| | 1 | 2 | 3 | 4 (Min) |
|---|---|---|---|---|
| Example I | 9.20 | 10.84 | 8.63 | 6.17 |
| Example II | 8.66 | 9.18 | 9.30 | 8.26 |
| Example III | 10.07 | 10.35 | 8.95 | 9.78 |
| Composition A | 2.05 | 1.96 | 2.08 | 2.30 |
| Composition B | 3.48 | 4.72 | 3.88 | 2.49 |
| Composition C | 4.62 | 8.80 | 8.95 | 7.93 |

SOLDERABILITY (RATED 1 TO 10)

Compositions all fired for 2 minutes

| | 600 | 625 | 650 | 675 | 700° C. |
|---|---|---|---|---|---|
| Example I | 6 | 7 | 8 | 8 | 7 |
| Example II | 7 | 8 | 8 | 8 | 7 |
| Example III | 8 | 7 | 7 | 9 | 5 |
| Composition A | 5 | 5 | 4 | 6 | 4 |
| Composition B | 3 | 2 | 3 | 6 | 5 |
| Composition C | 4 | 4 | 5 | 5 | 4 |

COEFFICIENT OF PERFORMANCE

Compositions fired at 600° C.

| | 1 | 2 | 3 | 4 (Min) |
|---|---|---|---|---|
| Example I | 0.388 | 0.602 | 0.402 | 0.386 |
| Example II | 0.251 | 0.619 | 0.613 | 0.596 |
| Example III | 0.524 | 0.596 | 0.656 | 0.539 |
| Composition A | 0.217 | 0.603 | 0.471 | 0.263 |
| Composition B | 0.327 | 0.481 | 0.528 | 0.475 |
| Composition C | 0.245 | 0.525 | 0.466 | 0.307 |

Compositions fired at 650° C.

| | 1 | 2 | 3 | 4 (Min) |
|---|---|---|---|---|
| Example I | 0.640 | 0.624 | 0.569 | 0.451 |
| Example II | 0.581 | 0.627 | 0.633 | 0.379 |
| Example III | 0.543 | 0.625 | 0.602 | 0.459 |
| Composition A | 0.305 | 0.579 | 0.414 | 0.291 |
| Composition B | 0.362 | 0.526 | 0.539 | 0.386 |
| Composition C | 0.398 | 0.512 | 0.497 | 0.393 |

Compositions fired at 700° C.

| | 1 | 2 | 3 | 4 (Min) |
|---|---|---|---|---|
| Example I | 0.548 | 0.426 | 0.355 | 0.316 |
| Example II | 0.587 | 0.639 | 0.606 | 0.600 |
| Example III | 0.489 | 0.612 | 0.590 | 0.417 |
| Composition A | 0.467 | 0.404 | 0.383 | 0.236 |
| Composition B | 0.383 | 0.431 | 0.495 | 0.463 |
| Composition C | 0.308 | 0.427 | 0.366 | 0.204 |

I claim:

1. A solar cell comprising a body of silicon semiconductor material and at least one contact adhered thereto for accepting and directing a flow of electricity away from said body, said contact comprising an n-type region of said semiconductor body on which there has been screen printed a paste composition consisting essentially of a mixture of silver powder and lead bismuthate glass frit powder in a vehicle and solvent mixture, said composition having been heated to drive off the vehicle and solvent and thereafter fired at 550° to 750° C.

2. A solar cell according to claim 1 wherein the composition contains 65 to 75 percent by weight silver powder and a lead bismuthate glass frit powder dispersed in 25 to 35 percent by weight of a vehicle and solvent mixture.

3. A method of preparing a solar cell comprising screen printing on an n-type layer of a semiconductor wafer a paste composition consisting essentially of a mixture of silver powder and lead bismuthate glass frit powder in a vehicle and solvent mixture, heating to remove the vehicle and solvent and thereafter firing at a temperature between 550° to 750° C. for a time between one and ten minutes.

* * * * *